United States Patent
Cazorla et al.

(10) Patent No.: US 8,271,215 B2
(45) Date of Patent: Sep. 18, 2012

(54) METHOD AND PRACTICAL USE SYSTEM FOR MEASURING THE IMBALANCE POWER IN ELECTRICAL INSTALLATIONS, AND THE DEVICE FOR CALIBRATION THEREOF

(75) Inventors: Navarro Antonio Cazorla, Valencia (ES); Garcia José Giner, Valencia (ES); Martinez Vicente Leon, Valencia (ES); Romeu Joaquín Montañana, Valencia (ES)

(73) Assignee: Universidad Politecnica de Valencia, Valencia (ES)

( * ) Notice: Subject to any disclaimer, the term of this patent is extended or adjusted under 35 U.S.C. 154(b) by 419 days.

(21) Appl. No.: 12/598,341

(22) PCT Filed: Apr. 30, 2008

(86) PCT No.: PCT/ES2008/000296
§ 371 (c)(1),
(2), (4) Date: Jan. 13, 2010

(87) PCT Pub. No.: WO2008/132258
PCT Pub. Date: Nov. 6, 2008

(65) Prior Publication Data
US 2010/0121586 A1    May 13, 2010

(30) Foreign Application Priority Data

Apr. 30, 2007   (ES) .................................. 200701224

(51) Int. Cl.
*G01R 21/00* (2006.01)
(52) U.S. Cl. ........................................ 702/60
(58) Field of Classification Search .................. 702/60, 702/64, 77, 182–185, 188
See application file for complete search history.

(56) References Cited

U.S. PATENT DOCUMENTS

2010/0070213 A1 * 3/2010 Anklam .......................... 702/60
2010/0271039 A1 * 10/2010 Durston et al. ................ 324/533

OTHER PUBLICATIONS

Corrected version of International Search Report, issued Aug. 21, 2008 in PCT/ES2008/000296 (with English translation).
Written Opinion of the International Searching Authority, issued Aug. 21, 2008 in PCT/ES2008/000296 (with English translation).

(Continued)

*Primary Examiner* — Edward Raymond
(74) *Attorney, Agent, or Firm* — Wenderoth, Lind & Ponack, L.L.P.

(57) ABSTRACT

Method and practical use system for measuring the imbalance potential of an electrical installation or system comprising:
i) acquiring instantaneous values of voltage ($v_A$, $v_B$, $v_C$) and electrical intensity ($i_A$, $i_B$, $i_C$) of each of the phases A, B, C of the installation, and breaking them down into their fundamental frequency components ($v_{A1}$, $v_{B1}$, $v_{C1}$), ($i_{A1}$, $i_{B1}$, $i_{C1}$);
ii) obtaining effective voltage and intensity values and angles for initial phase difference between voltage and intensity, and, starting from these effective values obtaining active powers ($P_A$, $P_B$, $P_C$) and reactive ($Q_A$, $Q_B$, $Q_C$) potentials for each of the phases;
iii) from the active and reactive potentials, obtaining (4) a phasor imbalance potentials ($\overline{A}_U$) according to the following expression:

$$\overline{A}_U = \sqrt{2}(\overline{p} \cdot |P_A + a^2 P_B + aP_C| + \overline{q} \cdot |Q_A + a^2 Q_B + aQ_C|)$$

where $a = 1_{|120°}$ and p and q are orthogonal unit phasors.
The invention also relates to a device for calibrating (21) instruments for measurement instruments of this imbalance power.

7 Claims, 6 Drawing Sheets

OTHER PUBLICATIONS

Power System Instrumentation and Measurements Committee of the IEEE Power Engineering Society, "*IEEE Trial-Use Standard Definitions for the Measurement of Electric Power Quantities Under Sinusoidal, Nonsinusoidal, Balanced, or Unbalanced Conditions*", The Institute of Electrical and Electronics Engineers, Inc., New York, NY, Jun. 21, 2000.

Willems, Jacques L., et al., "*Addendum to the Apparent Power Concept and the IEEE Standard 1459-2000*", IEEE Transactions on Power Delivery, vol. 20, No. 2, Apr. 2005.

International Search Report issued Aug. 21, 2008 in International (PCT) Application No. PCT/ES2008/000296.

León-Martinez et al. "*Phasor total unbalance power: formulation and some properties*", Instrument and Measurement Technology Conference—IMTC 2007, Warsaw, Poland, May 1-3, 2007.

Willems et al. "*The apparent power concept and the IEEE Standard 1459-2000*", IEEE Transactions on Power Delivery, vol. 20, No. 2, Apr. 2005.

Montañana-Romeu et al. "*Measurement of energies associated of power quality with unbalanced and nonsinusoidal voltages in electric power systems*", 14$^{th}$ PSCC, Sevilla, Jun. 24-28, 2002.

* cited by examiner

METHOD AND PRACTICAL USE SYSTEM FOR MEASURING THE IMBALANCE POWER IN ELECTRICAL INSTALLATIONS, AND THE DEVICE FOR CALIBRATION THEREOF

OBJECT OF THE INVENTION

The present invention relates in general to the measurement and calibration of measurement instruments for the phenomenon of imbalance in electrical facilities, and more particularly to three-phase electrical systems with three and four wires.

BACKGROUND OF THE INVENTION

Imbalance power is a concept that is known in the technical literature, and is a magnitude which quantifies the effects of the phenomenon of imbalance in electrical facilities. Different formulations have been developed for this imbalance power—taking into account different theories established on electrical power—which only give its magnitude, a real number. The imbalance power is not conservative, in other words, it does not obey the Principle of Conservation of Energy, and therefore the imbalance power of an electrical facility is not equal to the sum of the imbalance powers corresponding to each of its component elements. This greatly limits and hinders its application for the measurement of the effects of imbalances in industrial practice.

The formulation of the imbalance power in complex form is not known in the technical literature at the present moment. This magnitude, which has been referred as the "imbalance power phasor" by the authors of this invention, permits the value of the imbalance power to be determined in any electrical facility by knowing the imbalances of its component parts. The system and method of measurement that are claimed permit this function to be carried out.

Moreover, calibrators of measurement instruments for the imbalance power formed by passive elements are not known in industrial practice.

DESCRIPTION OF THE INVENTION

The invention relates to a method and to a system for the measurement of the imbalance power of an electrical facility and device for its calibration.

To achieve this, the concept of "imbalance power phasor" is established as a fundamental contribution, this being a magnitude whose modulus is the imbalance power and whose argument indicates the phase or phases in which the imbalance is greatest, along with whether the resistive or reactive loads have a greater impact on the imbalance. One of the properties, among others, of this new magnitude, which is a complex number rather than real, is that the imbalance power phasor of an electrical system or facility is equal to the sum of the imbalance power phasors of each of the parts of the electrical system or facility, which considerably simplifies the obtaining of the value of the total imbalance power of the system.

This "imbalance power phasor" magnitude is not currently known in the technical literature and therefore measurement equipment for the imbalance power, both commercial equipment and that existing at the research level, cannot obtain the value of the imbalance power of the system on the basis of each of its subsystems or component parts.

The present invention provides a method and system for measurement of the imbalance power of an electrical system or facility, a magnitude that is expressed as a complex number, with modulus and argument, thereby overcoming the limitations mentioned above. The formulation of the imbalance power in complex form makes it possible for the total imbalance power phasor for an electrical facility or system to be equal to the sum of the imbalance power phasors of each of its elements; in this way it is possible to obtain the value and the effects of the imbalances in a part of the electrical facility starting from the values of the imbalances in each of its components.

In accordance with a first aspect of the invention, it relates to a method of measurement of the imbalance power phasor of an electrical facility or system which comprises:
 i) acquiring instantaneous values of voltage ($v_A$, $v_B$, $v_C$) and current ($i_A$, $i_B$, $i_C$) of each of the phases A, B, C of the electrical facility or system, and decomposing them into their components at fundamental frequency ($v_{A1}$, $v_{B1}$, $v_{C1}$), ($i_{A1}$, $i_{B1}$, $i_{C1}$);
 ii) obtaining effective values of voltage and current and angles of initial phase displacement between voltage and current, and, starting from these effective values, obtaining active powers ($P_A$, $P_B$, $P_C$) and reactive powers ($Q_A$, $Q_B$, $Q_C$) for each one of the phases;
 iii) starting from the active and reactive powers, an imbalance power phasor ($\overline{A}_U$) is obtained according to the following expression:

$$\overline{A}_U = \sqrt{2}(\overline{p}\cdot|P_A + a^2 P_B + aP_C| + \overline{q}\cdot|Q_A + a^2 Q_B + aQ_C|)$$

where $a = 1_{|120°}$ and p and q are orthogonal unit phasors.

In accordance with one possible embodiment of the inventive method, in step ii) effective values are obtained of voltage ($V_{A1}$, $V_{B1}$, $V_{C1}$) and current ($I_{A1}$, $I_{B1}$, $I_{C1}$) and phase displacement angles ($\phi_{A1}$, $\phi_{B1}$, $\phi_{C1}$) between voltage and current for the fundamental frequency; and the active powers ($P_A$, $P_B$, $P_C$) and reactive powers ($Q_A$, $Q_B$, $Q_C$) for each one of the phases are calculated according to the following expression:

$$P_A = V_{A1}\cdot I_{A1}\cdot\cos\phi_{A1} \quad Q_A = V_{A1}\cdot I_{A1}\cdot\sin\phi_{A1}$$

$$P_B = V_{B1}\cdot I_{B1}\cdot\cos\phi_{B1} \quad Q_B = V_{B1}\cdot I_{B1}\cdot\sin\phi_{B1}$$

$$P_C = V_{C1}\cdot I_{C1}\cdot\cos\phi_{C1} \quad Q_C = V_{C1}\cdot I_{C1}\cdot\sin\phi_{C1}$$

Alternatively, in step ii) effective values are obtained of positive sequence and fundamental frequency voltage ($V_{A1+}$, $V_{B1+}$, $V_{C1+}$) and phase displacement angles ($\phi_{A1+}$, $\phi_{B1+}$, $\phi_{C1+}$) between voltage and current for the fundamental frequency ($I_{A1}$, $I_{B1}$, $I_{C1}$); the active powers ($P_A$, $P_B$, $P_C$) and reactive powers ($Q_A$, $Q_B$, $Q_C$) for each one of the phases are calculated according to the following expression:

$$P_A = V_{A1+}\cdot I_{A1}\cdot\cos\phi_{A1+} \quad Q_A = V_{A1+}\cdot I_{A1}\cdot\sin\phi_{A1+}$$

$$P_B = V_{B1+}\cdot I_{B1}\cdot\cos\phi_{B1+} \quad Q_B = V_{B1+}\cdot I_{B1}\cdot\sin\phi_{B1+}$$

$$P_C = V_{C1+}\cdot I_{C1}\cdot\cos\phi_{C1+} \quad Q_C = V_{C1+}\cdot I_{C1}\cdot\sin\phi_{C1+}$$

According to a second aspect of the invention, this relates to a system of measurement of the imbalance power of an electrical facility or system, which comprises:
 an acquisition module configured for acquiring instantaneous values of voltage ($v_A$, $v_B$, $v_C$) and current ($i_A$, $i_B$, $i_C$) of each of the phases A, B, C of said electrical facility;
 an analysis module configured for obtaining effective values of voltage ($V_{A1}$, $V_{B1}$, $V_{C1}$) and current ($I_{A1}$, $I_{B1}$, $I_{C1}$) and phase displacement angles ($\phi_{A1}$, $\phi_{B1}$, $\phi_{C1}$) between voltage and current for the fundamental frequency;
 an active and reactive powers module configured for obtaining active powers ($P_A$, $P_B$, $P_C$) and reactive powers ($Q_A$, $Q_B$, $Q_C$) for each one of the phases;

a phasor module configured for obtaining a complex number in polar form or in binomial form or imbalance power phasor $\overline{A}_U$, starting from the values of active and reactive powers according to the following expression:

$$\overline{A}_U = \sqrt{2}(\overline{p} \cdot |P_A + a^2 P_B + a P_C| + \overline{q} \cdot |Q_A + a^2 Q_B + a Q_C|)$$

where $a = I_{|120°}$ and p and q are orthogonal unit phasors.

In accordance with a preferred embodiment, the active and reactive powers module calculates those powers according to the following expression:

$$P_A = V_{A1} \cdot I_{A1} \cdot \cos \phi_{A1} \quad Q_A = V_{A1} \cdot I_{A1} \cdot \sin \phi_{A1}$$

$$P_B = V_{B1} \cdot I_{B1} \cdot \cos \phi_{B1} \quad Q_B = V_{B1} \cdot I_{B1} \cdot \sin \phi_{B1}$$

$$P_C = V_{C1} \cdot I_{C1} \cdot \cos \phi_{C1} \quad Q_C = V_{C1} \cdot I_{C1} \cdot \sin \phi_{C1}$$

According to another possible embodiment, the system furthermore includes a symmetries module configured for obtaining effective values of positive sequence and fundamental frequency voltage ($V_{A1+}$, $V_{B1+}$, $V_{C1+}$) and phase displacement angles ($\phi_{A1+}$, $\phi_{B1+}$, $\phi_{C1+}$) between voltage and current for the fundamental frequency; and in that case the active and reactive powers module calculates them according to the following expression:

$$P_A = V_{A1+} \cdot I_{A1} \cdot \cos \phi_{A1+} \quad Q_A = V_{A1+} \cdot I_{A1} \cdot \sin \phi_{A1+}$$

$$P_B = V_{B1+} \cdot I_{B1} \cdot \cos \phi_{B1+} \quad Q_B = V_{B1+} \cdot I_{B1} \cdot \sin \phi_{B1+}$$

$$P_C = V_{C1+} \cdot I_{C1} \cdot \cos \phi_{C1+} \quad Q_C = V_{C1+} \cdot I_{C1} \cdot \sin \phi_{C1+}$$

The system furthermore preferably includes a display module configured for representing one or more magnitudes obtained in or used by the different modules comprising the system.

According to another aspect of the invention, this relates to a system of measurement of the imbalance power of an electrical facility or system, which comprises:

a stabilized, balanced and sinusoidal three-phase power supply source, responsible for supplying the energies corresponding to the inefficiency due to imbalance, and at least one standard imbalance circuit formed by passive elements, coils and capacitors or their equivalents formed by electronic converters, the values of those elements being a function of the modulus of the imbalance power phasor $\overline{A}_U$, this being calculated as indicated above.

The standard circuit or circuits for the imbalance power absorb the imbalance current, calibrated to a pre-set value.

These calibrating devices contribute simplicity, economy and a physical basis for the measurement of the imbalance power in comparison with other possible electronic calibrators, available on the market or not, which are less suited for industrial situations.

BRIEF DESCRIPTION OF THE DRAWINGS

In order to complement the description that is being made and with the aim of facilitating a better understanding of the characteristics of the invention, in accordance with preferred examples of practical embodiment thereof, included as an integral part of this description is a set of drawings in which, on an illustrative and non-limiting basis, the following have been represented.

DESCRIPTION OF A PREFERRED EMBODIMENT OF THE INVENTION

Figure 1:
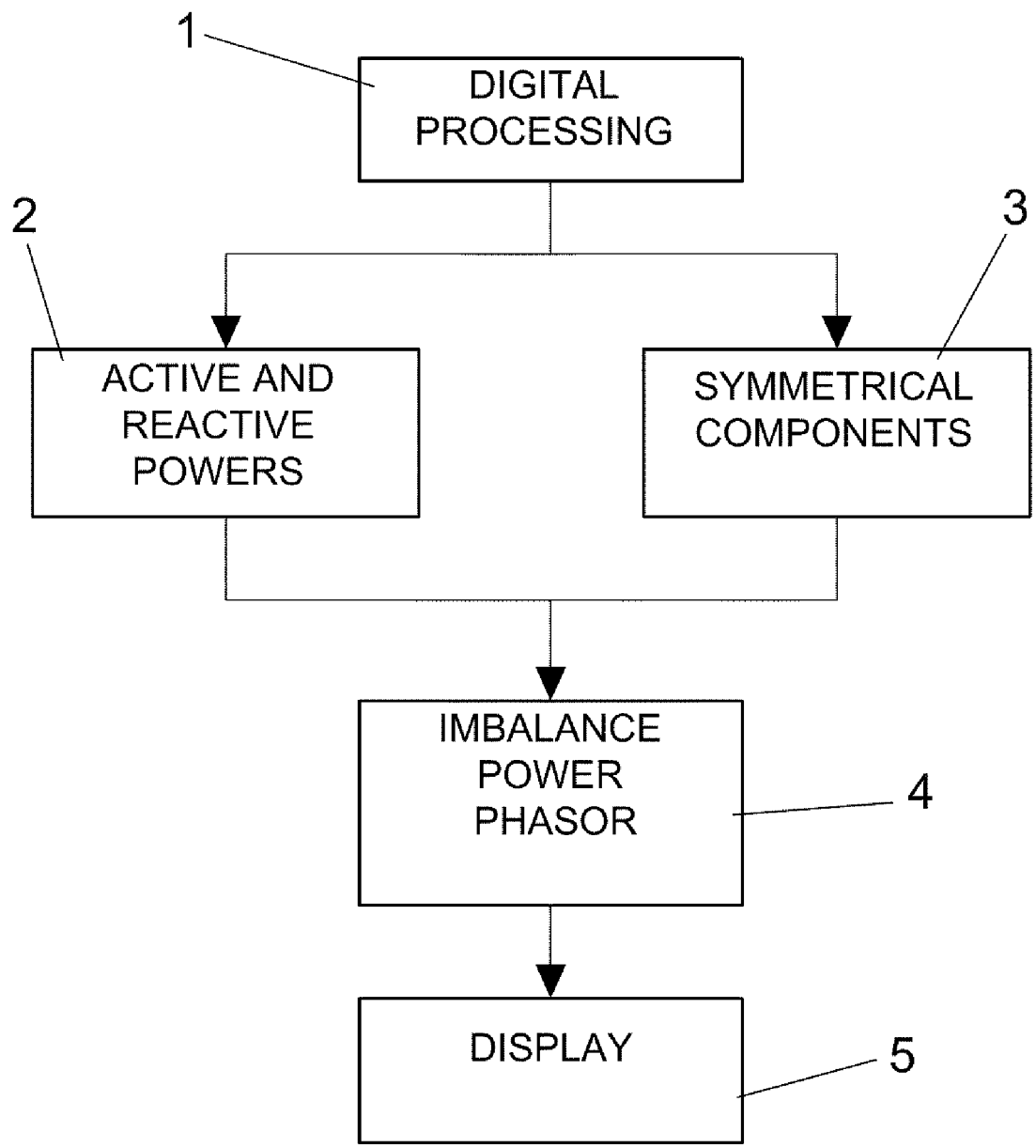
FIG. 1 is a diagram showing the operational sequence of the inventive method.

As shown in FIG. 1, a possible embodiment of the method for measurement of the imbalance power phasor in an electrical facility, the object of the present invention, comprises the following operations:

Digital processing (1) of the sampled signals obtained by the physical system (6) (see FIG. 2) for measurement and acquisition of electrical signals from the device, obtaining the matrices of effective values and initial phases of voltage and current at fundamental frequency for each phase, a total of six matrices for each phase of voltage and current.

With these matrices one obtains (in 3) the matrices of effective values and initial phases for the positive sequence components with a matrix for the positive sequence voltages.

Starting from the matrices of effective values and initial phases of voltage and current for the fundamental frequency, the active and reactive powers are obtained for each of the phases (2).

Starting from the active and reactive powers, the imbalance power phasor is obtained (in 4) according to the expression [1] stated further below.

The graphic and numerical information of the imbalance power phasor, along with certain values of the physical magnitudes used during the method, are displayed (5) in a display device.

Figure 2:
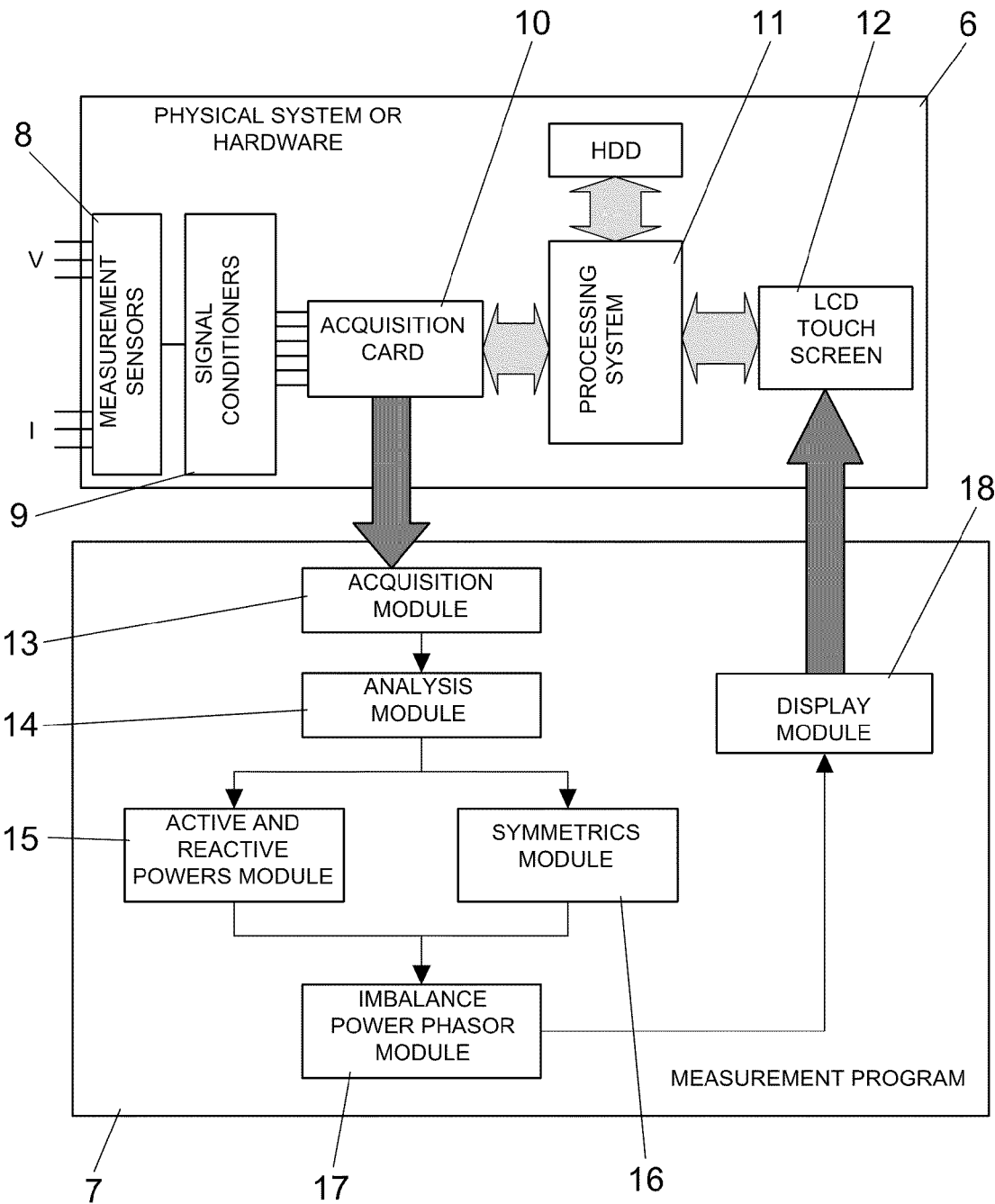
FIG. 2 is a diagram representing a possible embodiment of the device for measurement of the imbalance power phasor of the invention.

The device for putting into practice the measurement method, as shown in FIG. 2, is made up of a physical system for measurement and acquisition of electrical signals (6)—hardware—and a program for measurement of the electrical power 7.

The physical system (6) consists of some measurement sensors (8) for voltage and current, which measure their instantaneous values; some signal conditioners (9) which adapt the current from the secondary of each sensor to the voltage applicable to the analog inputs of the acquisition card; said acquisition card (10) or equivalent device which converts the analog signals for voltage and current into a series of discrete samples which are used as the input in the measurement program; a processing system (11) with a mother board in which the acquisition card (10) is inserted so that the discrete samples of the voltage and current signals can be exchanged with the measurement program (7); and a LCD touch screen or display device (12) in which is displayed all the information on the waveforms and the value of all the electrical magnitudes related to the measurement of the imbalance power phasor: voltages, currents, active and reactive powers, symmetrical components, and imbalance power phasor for energies.

The measurement program (7) consists of the following modules:

Acquisition module (13) which acquires samples of voltage and current, and saves them in a vector for each one of them.

Analysis module (14 which obtains the matrices of the voltages and currents in effective value and in phase for the fundamental frequency, on the basis of the samples acquired in the previous module; the effective values of all the voltages and currents of each of the phases are also obtained by numerical integration.

Symmetrics module (16) which obtains the matrices of the positive sequence components, in effective value and in phase of the voltages for the fundamental frequency, on the basis of the matrices obtained in the previous module.

Active and reactive powers module (15) in charge of obtaining the values of the active and reactive powers for each type of topology of the electrical facility.

Imbalance power phasor module (17) in charge of obtaining the value of the imbalance power phasor.

A typical application illustrating that mentioned above is, among others, the process of obtaining the imbalance power phasor in one of the transformation centers of a town or a factory.

Figure 4:
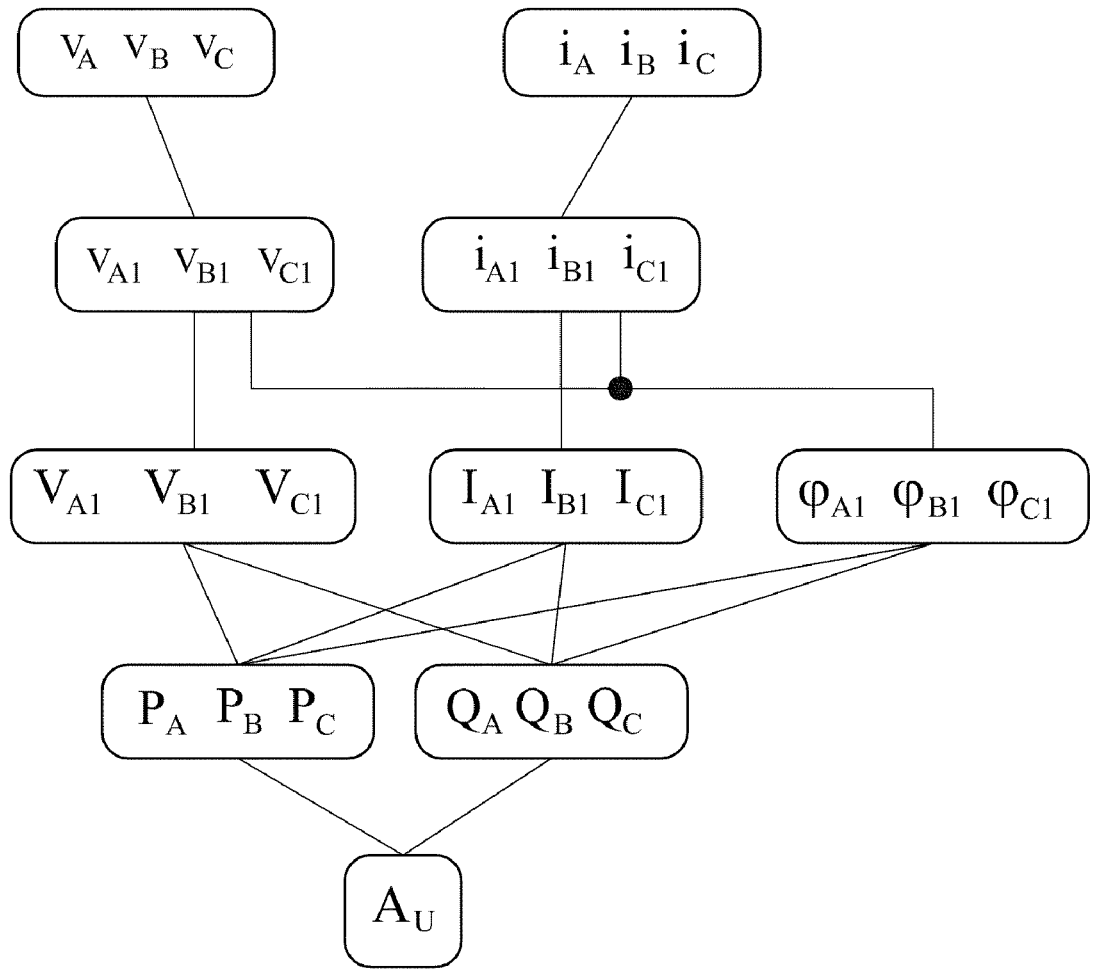
FIG. 4 is a diagram representing a possible method for obtaining the imbalance power phasor.

FIG. 4 diagrammatically shows one possible calculation process for the said magnitude. The instantaneous values of voltages ($v_A$, $v_B$, $v_C$) and currents ($i_A$, $i_B$, $i_C$) of the different phases are registered and decomposed into their fundamental frequency components ($v_{A1}$, $v_{B1}$, $v_{C1}$), ($i_{A1}$, $i_{B1}$, $i_{C1}$), 50/60 Hz, and into their harmonic components. Then, the effective values and the phase displacement angles are obtained of the fundamental frequency phase voltages and currents ($V_{A1}$, $V_{B1}$, $V_{C1}$), ($I_{A1}$, $I_{B1}$, $I_{C1}$), ($\phi_{A1}$, $\phi_{B1}$, $\phi_{C1}$) With these values, the active powers ($P_A$, $P_B$, $P_C$) and reactive powers ($Q_A$, $Q_B$, $Q_C$) for each phase are obtained according to the following expressions:

$$P_A = V_{A1} \cdot I_{A1} \cdot \cos \phi_{A1} \quad Q_A = V_{A1} \cdot I_{A1} \cdot \sin \phi_{A1}$$

$$P_B = V_{B1} \cdot I_{B1} \cdot \cos \phi_{B1} \quad Q_B = V_{B1} \cdot I_{B1} \cdot \sin \phi_{B1}$$

$$P_C = V_{C1} \cdot I_{C1} \cdot \cos \phi_{C1} \quad Q_C = V_{C1} \cdot I_{C1} \cdot \sin \phi_{C1}$$

Finally, the active and reactive power values of each phase are substituted into the following expression of the imbalance power phasor ($\overline{A}_U$):

$$\overline{A}_U = \sqrt{2}(\overline{p} \cdot |P_A + a^2 P_B + a P_C| + \overline{q} \cdot |Q_A + a^2 Q_B + a Q_C|)$$

an expression that is original, and in which $a = 1_{|120°}$ and p and q are orthogonal unit phasors.

Figure 5:
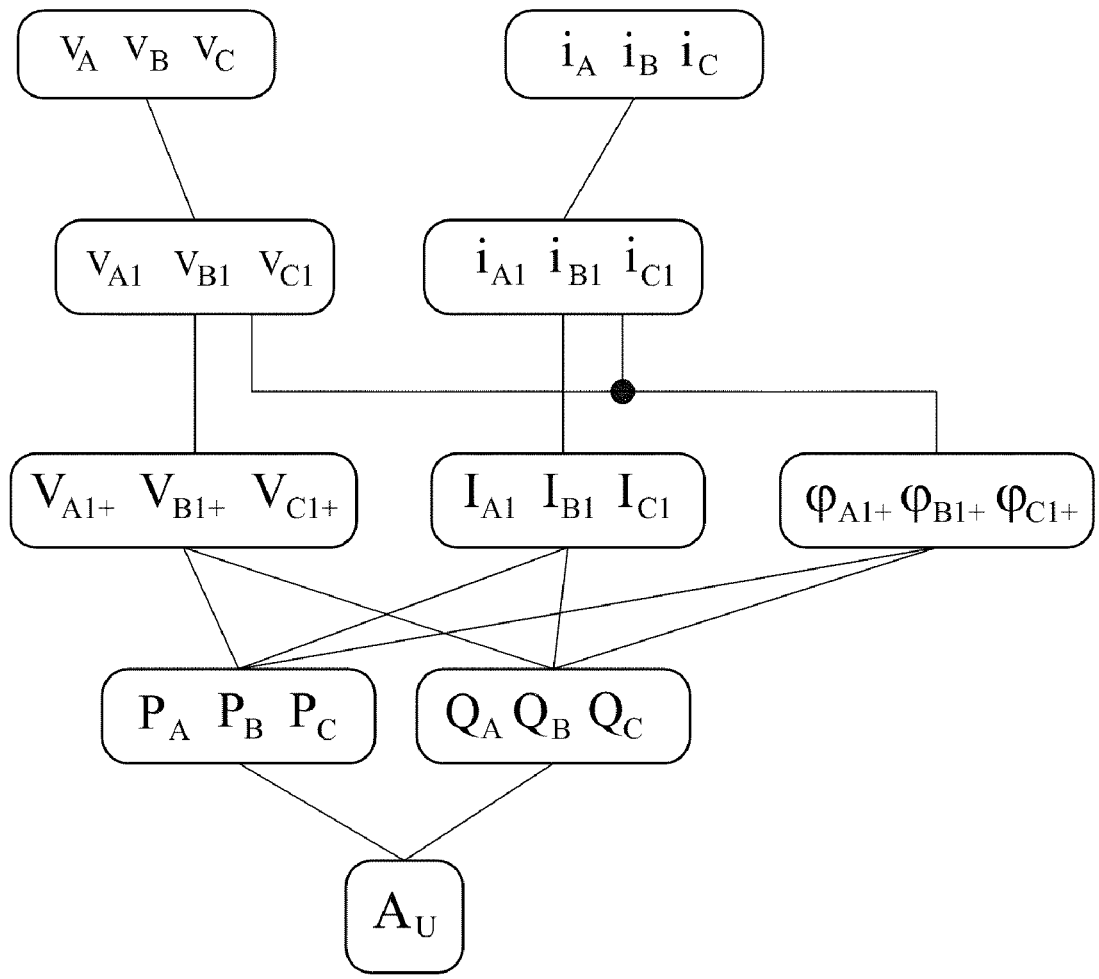
FIG. 5 is a diagram representing a possible alternative method for determining the imbalance power phasor.

As shown diagrammatically in FIG. 5, another alternative method for obtaining the imbalance power phasor with a very good approximation consists of calculating the active and reactive powers of each phase starting from the symmetrical components of the fundamental frequency phase voltages. As with the above case, the instantaneous values of voltages ($v_A$, $v_B$, $v_C$) and currents ($i_A$, $i_B$, $i_C$) of the different phases are registered and decomposed into their fundamental frequency components ($v_{A1}$, $v_{B1}$, $v_{C1}$), ($i_{A1}$, $i_{B1}$, $i_{C1}$), 50/60 Hz, and into their harmonic components. Applying the expressions of the Stokvis-Fortescue Theorem, the effective values are obtained for the positive sequence and fundamental frequency voltages ($V_{A1+}$, $V_{B1+}$, $V_{C1+}$), along with the phase displacement angles ($\phi_{A1+}$, $\phi_{B1+}$, $\phi_{C1+}$) of these voltages with the fundamental frequency currents; and starting from these, the active powers ($P_A$, $P_B$, $P_C$) and reactive powers ($Q_A$, $Q_B$, $Q_C$) are obtained according to the following expressions:

$$P_A = V_{A1+} \cdot I_{A1} \cdot \cos \phi_{A1+} \quad Q_A = V_{A1+} \cdot I_{A1} \cdot \sin \phi_{A1+}$$

$$P_B = V_{B1+} \cdot I_{B1} \cdot \cos \phi_{B1+} \quad Q_B = V_{B1+} \cdot I_{B1} \cdot \sin \phi_{B1+}$$

$$P_C = V_{C1+} \cdot I_{C1} \cdot \cos \phi_{C1+} \quad Q_C = V_{C1+} \cdot I_{C1} \cdot \sin \phi_{C1+}$$

for their later substitution into the expression [1] of the imbalance power phasor.

Finally, the measurement program (7) includes a display module (18), in charge of representing on screen the graphic and numerical information of the imbalance power phasor, along with the values of physical magnitudes, such as: effective values of the voltages and currents; active and reactive powers for each phase; symmetrical components at fundamental frequency.

Figure 3:
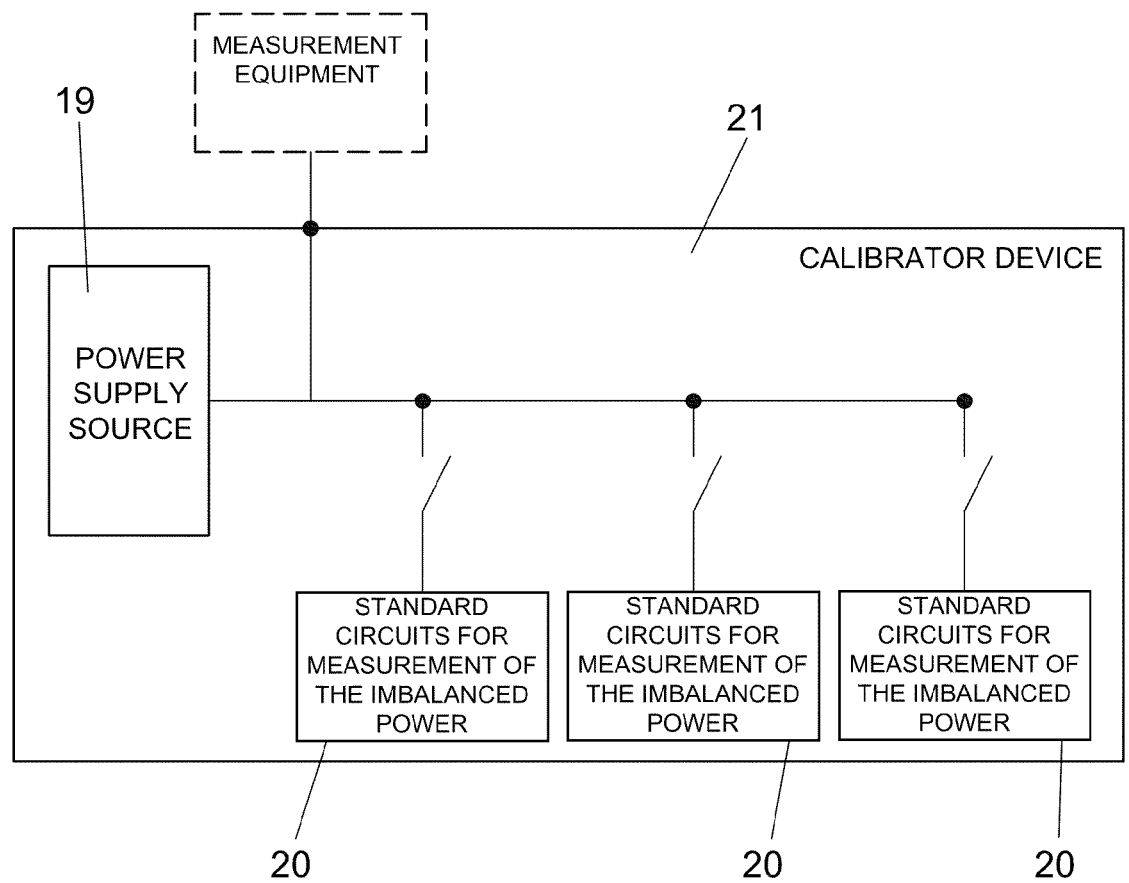
FIG. 3 is a diagram representing a possible structure of the calibrator of the imbalance power.

FIG. 3 shows a possible embodiment of the calibrator device (21) for measurement instruments of imbalance power. It is made up of a three-phase power supply source (19) and standard circuits for measurement of the imbalance power (20).

The power supply source (19) is the device in charge of supplying the energies corresponding to the inefficiency due to imbalance. It is a stabilized three-phase source, of frequency 50/60 Hz.

Figure 6:
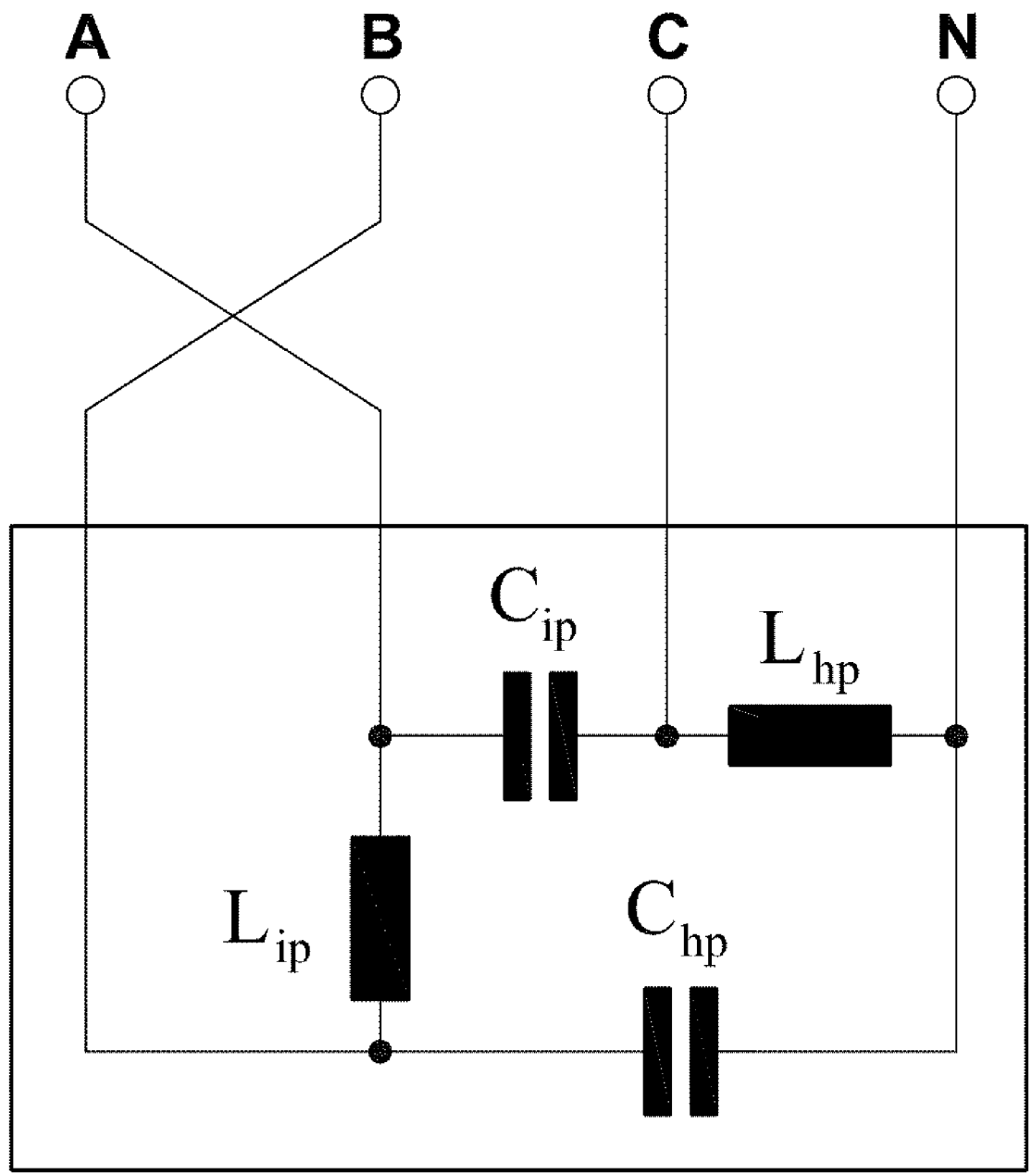
FIG. 6 is a diagram showing the arrangement of the standard for calibrating the imbalance power.

The standard imbalance circuits for the measure of the imbalance power (20) are passive devices consisting of coils and capacitors or their equivalents formed by electronic converters, which absorb the imbalance currents and powers, calibrated to a pre-set value. A preferred configuration of a standard circuit for the measure of the imbalance power (20) is shown in FIG. 6 and possible values of the elements constituting it are indicated below:

$$L_{ip} = \frac{3\sqrt{3} \, V_{AI}^2}{\sqrt{2} \, w A_U}$$

$$C_{ip} = \frac{\sqrt{2} \, A_U}{3\sqrt{3} \, w V_{AI}^2}$$

$$L_{hp} = \frac{\sqrt{6} \, V_{AI}^2}{w A_U}$$

$$C_{hp} = \frac{A_U}{\sqrt{6} \, w V_{AI}^2}$$

$w = 2\pi f$
$f = 50/60$ Hz
where Au is the imbalance power.

The invention has been described according to preferred embodiments thereof, but for an expert in the subject it will be obvious that there are a great many variations that can be introduced into those preferred embodiments without exceeding the object of the invention that is claimed.

The invention claimed is:

1. Method of measurement of the imbalance power of an electrical facility or system which comprises:
   i) acquiring instantaneous values of voltage ($v_A$, $v_B$, $v_C$) and current ($i_A$, $i_B$, $i_C$) of each of the phases A, B, C of the electrical facility or system, and decomposing them into their components at fundamental frequency ($v_{A1}$, $v_{B1}$, $v_{C1}$), ($i_{A1}$, $i_{B1}$, $i_{C1}$);
   ii) obtaining effective values of voltage ($V_{A1}$, $V_{B1}$, $V_{C1}$) and current ($I_{A1}$, $I_{B1}$, $I_{C1}$) and angles of initial phase displacement ($\phi_{A1}$, $\phi_{B1}$, $\phi_{C1}$) between voltage and current, for the fundamental frequency;
   iii) starting from the active and reactive powers, an imbalance power phasor ($\overline{A}_U$) is obtained (4) according to the following expression:
   $\overline{A}_U = \sqrt{2}(\overline{p} \cdot |P_A + a^2 P_B + a P_C| + \overline{q} \cdot |Q_A + a^2 Q_B + a Q_C|)$ wherein $a = 1_{|120°}$ and p and q are orthogonal unit phasors and wherein said active powers ($P_A$, $P_B$, $P_C$) and reactive powers ($Q_A$, $Q_B$, $Q_C$) are obtained starting from the effective values for the fundamental frequency obtained in step ii), for each one of the phases according to the following expression:

$$P_A = V_{A1} \cdot I_{A1} \cdot \cos \phi_{A1} \quad Q_A = V_{A1} \cdot I_{A1} \cdot \sin \phi_{A1}$$

$$P_B = V_{B1} \cdot I_{B1} \cdot \cos \phi_{B1} \quad Q_B = V_{B1} \cdot I_{B1} \cdot \sin \phi_{B1}$$

$$P_C = V_{C1} \cdot I_{C1} \cdot \cos \phi_{C1} \quad Q_C = V_{C1} \cdot I_{C1} \cdot \sin \phi_{C1}$$

or starting from the effective values for the fundamental frequency obtained in step ii), obtaining effective values of positive sequence and fundamental frequency voltage ($V_{A1+}$, $V_{B1+}$, $V_{C1+}$) and phase displacement angles ($\phi_{A1+}$, $\phi_{B1+}$, $\phi_{C1+}$) between voltage and current for the fundamental frequency, for each one of the phases according to the following expression:

$$P_A = V_{A1+} \cdot I_{A1} \cdot \cos \phi_{A1+} \quad Q_A = V_{A1+} \cdot I_{A1} \cdot \sin \phi_{A1+}$$

$$P_B = V_{B1+} \cdot I_{B1} \cdot \cos \phi_{B1+} \quad Q_B = V_{B1+} \cdot I_{B1} \cdot \sin \phi_{B1+}; \text{ and}$$

$$P_C = V_{C1+} \cdot I_{C1} \cdot \cos \phi_{C1+} \quad Q_C = V_{C1+} \cdot I_{C1} \cdot \sin \phi_{C1+}$$

iv) starting from the active and reactive powers, an imbalance power phasor ($\overline{A}_U$) is obtained (4) according to the following expression:

$$\overline{A}_U = \sqrt{2}(\overline{p} \cdot |P_A + a^2 P_B + a P_C| + \overline{q} \cdot |Q_A + a^2 Q_B + a Q_C|)$$

where $a = I_{|120°}$ and p and q are orthogonal unit phasors.

2. A system of measurement of the imbalance power of an electrical facility or system, which comprises:
   an acquisition module (13) configured for acquiring instantaneous values of voltage ($v_A$, $v_B$, $v_C$) and current ($i_A$, $i_B$, $i_C$) of each of the phases A, B, C of said electrical facility;
   an analysis module (14) configured for obtaining effective values of voltage ($V_{A1}$, $V_{B1}$, $V_{C1}$) and current ($I_{A1}$, $I_{B1}$, $I_{C1}$) and phase displacement angles ($\phi_{A1}$, $\phi_{B1}$, $\phi_{C1}$) between voltage and current for the fundamental frequency;
   an active and reactive powers module (15) configured for obtaining active powers ($P_A$, $P_B$, $P_C$) and reactive powers ($Q_A$, $Q_B$, $Q_C$) for each one of the phases;
   a phasor module (17) configured for obtaining a complex number in polar form or in binomial form or imbalance power phasor ($\overline{A}_U$), starting from the values of active and reactive powers according to the following expression:

$$\overline{A}_U = \sqrt{2}(\overline{p} \cdot |P_A + a^2 P_B + a P_C| + \overline{q} \cdot |Q_A + a^2 Q_B + a Q_C|)$$

wherein $a = I_{|120°}$ and p and q are orthogonal unit phasors.

3. System according to claim 2, characterized in that the active and reactive powers module (15) calculates those powers according to the following expression:

$$P_A = V_{A1} \cdot I_{A1} \cdot \cos \phi_{A1} \quad Q_A = V_{A1} \cdot I_{A1} \cdot \sin \phi_{A1}$$

$$P_B = V_{B1} \cdot I_{B1} \cdot \cos \phi_{B1} \quad Q_B = V_{B1} \cdot I_{B1} \cdot \sin \phi_{B1}$$

$$P_C = V_{C1} \cdot I_{C1} \cdot \cos \phi_{C1} \quad Q_C = V_{C1} \cdot I_{C1} \cdot \sin \phi_{C1}.$$

4. System according to claim 3, further including a display module (18) configured for representing one or more magnitudes obtained in or used by the different modules comprising up the system.

5. System according to claim 2, characterized in that it furthermore includes a symmetries module (16) configured for obtaining effective values of positive sequence and fundamental frequency voltage ($V_{A1+}$, $V_{B1+}$, $V_{C1+}$) and phase displacement angles ($\phi_{A1+}$, $\phi_{B1+}$, $\phi_{C1+}$) between voltage and current for the fundamental frequency ($I_{A1}$, $I_{B1}$, $I_{C1}$);
   and in that the active and reactive powers module (15) calculates them according to the following expression:

$$P_A = V_{A1+} \cdot I_{A1} \cdot \cos \phi_{A1+} \quad Q_A = V_{A1+} \cdot I_{A1} \cdot \sin \phi_{A1+}$$

$$P_B = V_{B1+} \cdot I_{B1} \cdot \cos \phi_{B1+} \quad Q_B = V_{B1+} \cdot I_{B1} \cdot \sin \phi_{B1+}$$

$$P_C = V_{C1+} \cdot I_{C1} \cdot \cos \phi_{C1+} \quad Q_C = V_{C1+} \cdot I_{C1} \cdot \sin \phi_{C1+}.$$

6. System according to claim 2, further including a display module (18) configured for representing one or more magnitudes obtained in or used by the different modules comprising up the system.

7. System according to claim 5, further including a display module (18) configured for representing one or more magnitudes obtained in or used by the different modules comprising up the system.

* * * * *